(12) United States Patent
Kadowaki

(10) Patent No.: US 9,847,779 B2
(45) Date of Patent: Dec. 19, 2017

(54) DEAD TIME ADJUSTING CIRCUIT

(71) Applicant: Rohm Co., Ltd., Kyoto (JP)

(72) Inventor: Keisuke Kadowaki, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 11 days.

(21) Appl. No.: 15/018,999

(22) Filed: Feb. 9, 2016

(65) Prior Publication Data

US 2016/0248412 A1  Aug. 25, 2016

(30) Foreign Application Priority Data

Feb. 23, 2015 (JP) .................. 2015-032662

(51) Int. Cl.
| | |
|---|---|
| *H02P 1/00* | (2006.01) |
| *H02P 1/28* | (2006.01) |
| *H02P 3/00* | (2006.01) |
| *H02P 7/06* | (2006.01) |
| *H03K 5/151* | (2006.01) |
| *H03K 5/24* | (2006.01) |
| *H03K 17/16* | (2006.01) |
| *H03K 5/133* | (2014.01) |
| *H02M 1/38* | (2007.01) |

(52) U.S. Cl.
CPC ............ *H03K 5/1515* (2013.01); *H02M 1/38* (2013.01); *H03K 5/133* (2013.01); *H03K 5/24* (2013.01); *H03K 17/165* (2013.01)

(58) Field of Classification Search
CPC ........ H03K 5/1515; H03K 5/133; H02M 1/38
USPC ........................................... 318/504
See application file for complete search history.

(56) References Cited

U.S. PATENT DOCUMENTS

| | | | | |
|---|---|---|---|---|
| 6,294,954 B1* | 9/2001 | Melanson | ............... | H03F 1/32 326/83 |
| 2006/0164867 A1* | 7/2006 | Dikken | ............... | H02M 1/38 363/13 |
| 2012/0043950 A1* | 2/2012 | Truong | ............... | H02M 3/158 323/282 |
| 2014/0167722 A1* | 6/2014 | Lee | ............... | H02M 1/38 323/282 |
| 2015/0349762 A1* | 12/2015 | Kinder | ............... | H03K 5/159 327/108 |
| 2016/0211774 A1* | 7/2016 | Degner | ............... | H02M 7/53875 |

FOREIGN PATENT DOCUMENTS

JP      2003-338715      11/2003

* cited by examiner

*Primary Examiner* — Erick Glass
(74) *Attorney, Agent, or Firm* — Fish & Richardson P.C.

(57) ABSTRACT

In a dead time adjusting circuit, a switch voltage appearing at a connection node between a first output switch and a second output switch, which are connected in series between two different potentials, is monitored to detect a first dead time, which is from a time at which the second output switch is turned off to a time at which the first output switch is turned on, and a second dead time, which is from a time at which the first output switch is turned off to a time at which the second output switch is turned on, each of the first and second dead times being feedback-controlled to be identical to a predetermined target value.

16 Claims, 13 Drawing Sheets

DEAD TIME ADJUSTING CIRCUIT

CROSS-REFERENCE TO RELATED APPLICATION

This application is based upon and claims the benefit of priority from Japanese Patent Application No. 2015-32662, filed on Feb. 23, 2015, the entire contents of which are incorporated herein by reference.

TECHNICAL FIELD

The present disclosure relates to a dead time adjusting circuit.

BACKGROUND

Conventionally, a switch driving circuit for complimentarily turning on and off a first output switch and a second output switch connected in series between two different potentials is provided with a dead time (a simultaneous ON prevention time) during which both the switches are turned off to prevent a through current when an ON/OFF state of each of the switches is changed.

Further, as an example of the related art, there is known a dead time adjusting circuit for generating a direct current (DC) voltage signal in proportion to a dead time and adjusting the dead time using the generated DC voltage signal.

In the dead time adjusting circuit, a first driving signal for turning on and off the first output switch and a second driving signal for turning on and off the second output switch are monitored to generate the DC voltage signal in proportion to the dead time.

When a switching frequency fsw is relatively low (for example, when fsw is about 1 to 2 MHz), a desired dead time is about 10 to 20 ns, which is relatively long, and thus, there is no particular problem even in setting the dead time using the related art described above.

However, when the switching frequency fsw is relatively high (for example, when fsw is about 20 MHz), a desired dead time is very much shortened to a few ns. Thus, it is difficult to set a desired dead time using the related art in which the output switch driving signals are monitoring targets.

SUMMARY

The present disclosure provides some embodiments of a dead time adjusting circuit capable of appropriately adjusting a dead time.

According to one embodiment of the present disclosure, there is provided a dead time adjusting circuit, wherein a switch voltage appearing at a connection node between a first output switch and a second output switch, which are connected in series between two different potentials, is monitored to detect a first dead time, which is from a time at which the second output switch is turned off to a time at which the first output switch is turned on, and a second dead time, which is from a time at which the first output switch is turned off to a time at which the second output switch is turned on, each of the first and second dead times being feedback-controlled to be identical to a predetermined target value (first configuration).

The dead time adjusting circuit having the first configuration may further include: a dead time detecting part configured to monitor the switch voltage to generate first and second dead time detection signals indicating whether the first and second dead times are longer than the target value; and a delay part configured to increase and decrease ON timing delay amounts of the first and second output switches depending on the first and second dead time detection signals (second configuration).

In the dead time adjusting circuit having the second configuration, the delay part may include: a delay element having a plurality of stages and configured to delay ON timings of the first and second output switches; a stage number switching part configured to switch an effective stage number of the delay element; and a delay amount control part configured to control the stage number switching part depending on the first and second dead time detection signals to control the ON timing delay amounts of the first and second output switches (third configuration).

In the dead time adjusting circuit having the third configuration, the delay amount control part may be configured to control the stage number switching part to check logic levels of the first and second dead time detection signals at every predetermined period, decrease the effective stage number of the delay element when the first and second dead times are longer than the target values, and increase the effective stage number of the delay element when the first and second dead times are shorter than the target value (fourth configuration).

In the dead time adjusting circuit having any one of the second to fourth configurations, the dead time detecting part may include: first and second diodes, each of the first and second diodes having a cathode connected to an application terminal of the switch voltage; first and second integration parts configured to integrate anode voltages of the first and second diodes to generate first and second error voltages, respectively; first and second detection switches configured to conduct and block between the first and second diodes and the first and second integration parts, respectively; and first and second comparators configured to compare the first and second error voltages with predetermined reference voltages to generate the first and second dead time detection signals (fifth configuration).

In the dead time adjusting circuit having the fifth configuration, each of the first and second integration parts may include: an operational amplifier configured to output the first or second error voltage from an output terminal; a capacitor connected between an inverting input terminal and the output terminal of the operational amplifier; a first resistor connected between the inverting input terminal and the output terminal of the operational amplifier; a second resistor connected between the inverting input terminal of the operational amplifier and the first or second detection switch; a current source connected between a power source and a non-inverting input terminal of the operational amplifier; and a diode having an anode connected to the non-inverting input terminal of the operational amplifier and a cathode connected to a ground terminal (sixth configuration).

According to another embodiment of the present disclosure, there is provided a switch driving circuit including: a control circuit configured to generate a reference control signal; the dead time adjusting circuit having any one of the first to sixth configurations, configured to give a delay to the reference control signal to generate first and second control signals; and a driver circuit configured to generate first and second driving signals from the first and second control signals, respectively, and supply the generated first and second driving signals to the first and second output switches (seventh configuration).

According to still another embodiment of the present disclosure, there is provided a switching power supply device including: a switch output stage including the first and second output switches; and the switch driving circuit having the seventh configuration, configured to drive the switch output stage, wherein the switch output stage is driven to generate an output voltage from an input voltage (eighth configuration).

According to still another embodiment of the present disclosure, there is provided a motor driving device including: a switch output stage including first and second output switches; and the switch driving circuit having the seventh configuration, configured to drive the switch output stage, wherein the switch output stage is driven to supply a driving current to a motor (ninth configuration).

According to still another embodiment of the present disclosure, there is provided an electronic device including the switching power supply device having the eighth configuration or the motor driving device having the ninth configuration (tenth configuration).

BRIEF DESCRIPTION OF THE DRAWINGS

FIG. 6 is a block diagram illustrating a configuration example of a dead time detecting part 22a.

DETAILED DESCRIPTION

<Switching Power Supply Device>

Figure 1:
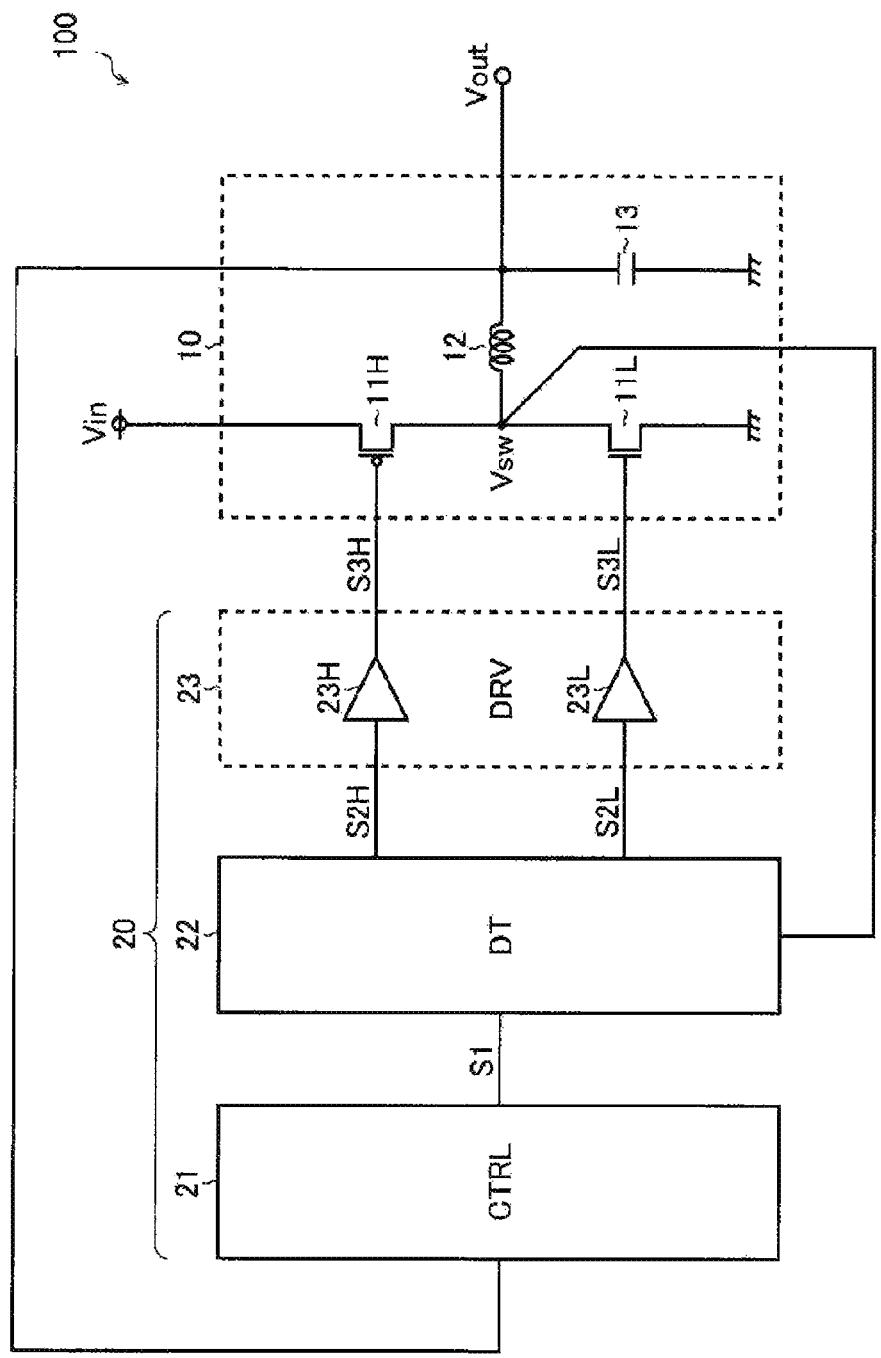
FIG. 1 is a block diagram illustrating a configuration example of a switching power supply device 100.

FIG. 1 is a block diagram illustrating a configuration example of a switching power supply device 100. The switching power supply device 100 of this configuration example is a boost type switching regulator (DC/DC converter) having a switch output stage 10 and a switch driving circuit 20.

The switch output stage 10 includes a first output switch 11H, a second output switch 11L, an output inductor 12, and an output capacitor 13. In this configuration example, a p-channel type metal oxide semiconductor field effect transistor (PMOSFET) is used as the first output switch 11H (output transistor) and an N-channel type MOSFET (NMOSFET) is used as the second output switch 11L (synchronous rectification transistor). Each of the ON resistance values of the first output switch 11H and the second output switch 11L is, for example, about 5 mΩ.

A first terminal (source) of the first output switch 11H is connected to a power input terminal (=application terminal of an input voltage Vin). Both a second terminal (drain) of the first output switch 11H and a first terminal (drain) of the second output switch 11L are connected to a first terminal of the output inductor 12. A second terminal (source) of the second output switch 11L is connected to a ground terminal (application terminal of a ground voltage (GND)). A first driving signal S3H is input to a control terminal (gate) of the first output switch 11H. A second driving signal S3L is input to a control terminal (gate) of the second output switch 11L. The first output switch 11H is set to be turned off when the first driving signal S3H has a high level and turned on when the first driving signal S3H has a low level. The second output switch 11L is set to be turned off when the second driving signal S3L has a low level and turned on when the second driving signal S3L has a high level.

A second terminal of the output inductor 12 and a first terminal of the output capacitor 13 are connected to an output terminal of an output voltage Vout. A second terminal of the output capacitor 13 is connected to the ground terminal. The output inductor 12 and the output capacitor 13 serve as a rectifying/smoothing part for rectifying and smoothing a switch voltage Vsw having a square wave appearing at a connection node between the first output switch 11H and the second output switch 11L to generate the output voltage Vout.

The switch driving circuit 20 is a circuit block for driving the switch output stage 10 to generate a desired output voltage Vout (for example, 1.8 V) from the input voltage Vin (for example, 3.3 V), and includes a control circuit 21, a dead time adjusting circuit 22, and a driver circuit 23.

The control circuit 21 generates a reference control signal S1 such that the output voltage Vout (or a feedback voltage corresponding thereto) matches a predetermined target value. The reference control signal S1 may be generated by applying a known output feedback control (pulse width modulation (PWM) control, pulse frequency modulation (PFM) control, or the like), and therefore, a detailed description thereof will be omitted.

The dead time adjusting circuit 22 is a circuit block for generating a first control signal S2H and a second control signal S2L by giving a delay to the reference control signal S1. More specifically, by monitoring the switch voltage Vsw input from the switch output stage 10, the dead time adjusting circuit 22 detects a first dead time d1 from a time at which the second output switch 11L is turned off to a time at which the first output switch 11H is turned on, and a second dead time d2 from a time at which the first output switch 11H is turned off to a time at which the second output switch 11L is turned on. The dead time adjusting circuit 22 performs a feedback control such that each of the first dead time d1 and the second dead time d2 matches a predetermined target value.

The driver circuit 23 is a circuit block for generating the first driving signal S3H and the second driving signal S3L from the first control signal S2H and the second control signal S2L, respectively, and supplying the generated first driving signal S3H and the second driving signal S3L to the first output switch 11H and the second output switch 11L, respectively. The driver circuit 23 includes a first driver 23H and a second driver 23L. The first driver 23H generates the first driving signal S3H from the first control signal S2H and supplies the generated first driving signal S3H to the control terminal (gate) of the first output switch 11H. The second driver 23L generates the second driving signal S3L from the second control signal S2L and supplies the generated second driving signal S3L to the control terminal (gate) of the second output switch 11L.

<Dead Time Adjusting Circuit>

Figure 2:
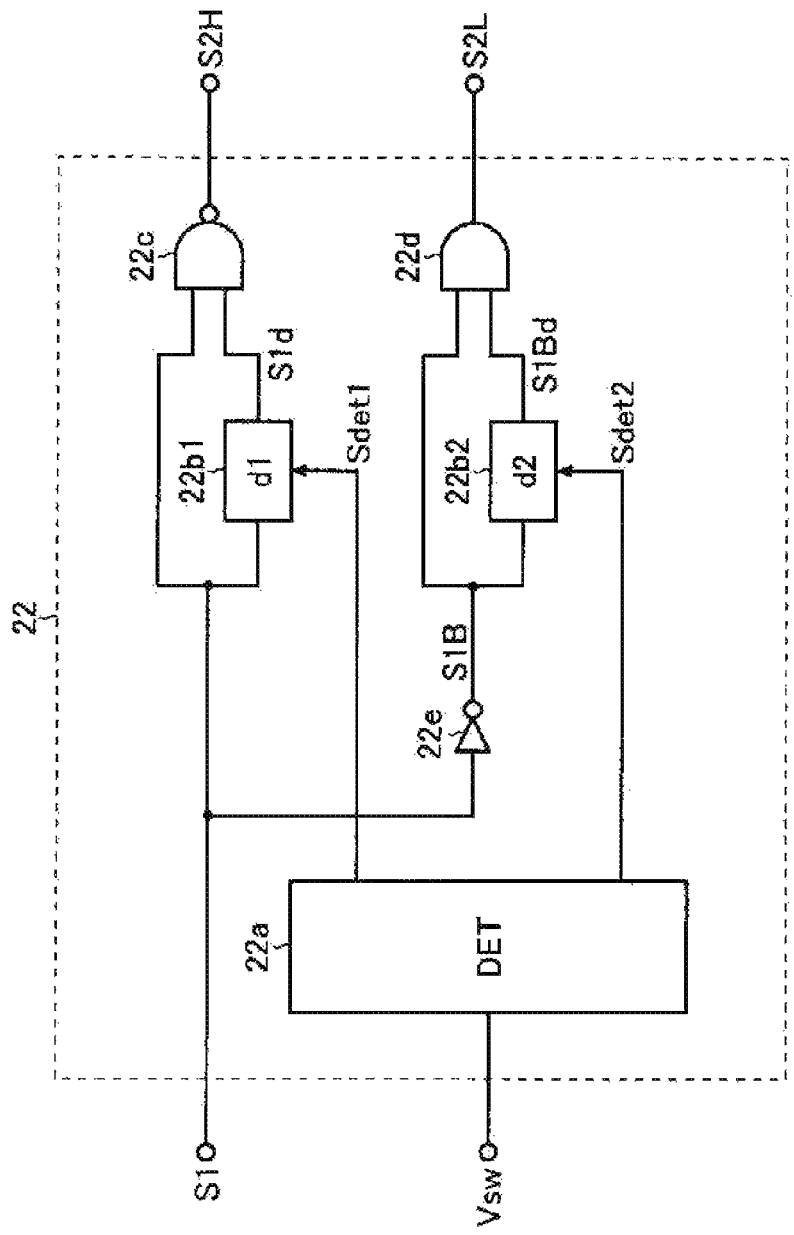
FIG. 2 is a block diagram illustrating a configuration example of a dead time adjusting circuit 22.

FIG. 2 is a block diagram illustrating a configuration example of the dead time adjusting circuit 22. The dead time adjusting circuit 22 of this configuration example includes a dead time detecting part 22a, delay parts 22b1 and 22b2, a NAND operator 22c, an AND operator 22d, and an inverter 22e.

The dead time detecting part 22a monitors the switch voltage Vsw and generates a first dead time detection signal Sdet1 and a second dead time detection signal Sdet2 indicating whether the first dead time d1 and the second dead time d2 are longer than a target value, respectively. The first dead time detection signal Sdet1 has a high level when the first dead time d1 is longer than the target value, and has a low level when the first dead time d1 is shorter than the target value. The second dead time detection signal Sdet2 has a high level when the second dead time d2 is longer than the target value, and has a low level when the second dead time d2 is shorter than the target value.

The delay part 22b1 gives a delay to the reference control signal S1 to generate a delayed reference control signal S1d. The delay part 22b1 serves to increase and decrease a delay amount (equivalent to an ON timing delay amount of the first output switch 11H) given to the reference control signal S1 depending on the first dead time detection signal Sdet1.

The delay part 22b2 gives a delay to an inverted reference control signal S1B to generate a delayed inverted reference control signal S1Bd. The delay part 22b2 serves to increase and decrease a delay amount (equivalent to an ON timing delay amount of the second output switch 11O) given to the inverted reference control signal S1B depending on the second dead time detection signal Sdet2.

The NAND operator 22c performs a NAND operation on the reference control signal S1 and the delayed reference control signal S1d to generate the first control signal S2H. The first control signal S2H has a high level when at least one of the reference control signal S1 and the delayed reference control signal S1d has a low level, and has a low level when both the reference control signal S1 and the delayed reference control signal S1d have a high level.

The AND operator 22d performs an AND operation on the inverted reference control signal S1B and the delayed inverted reference control signal S1Bd to generate the second control signal S2L. The second control signal S2L has a low level when at least one of the inverted reference control signal S1B and the delayed inverted reference control signal S1Bd has a low level, and has a high level when both the inverted reference control signal S1B and the delayed inverted reference control signal S1Bd have a high level.

<Delay Part>

Figure 3:
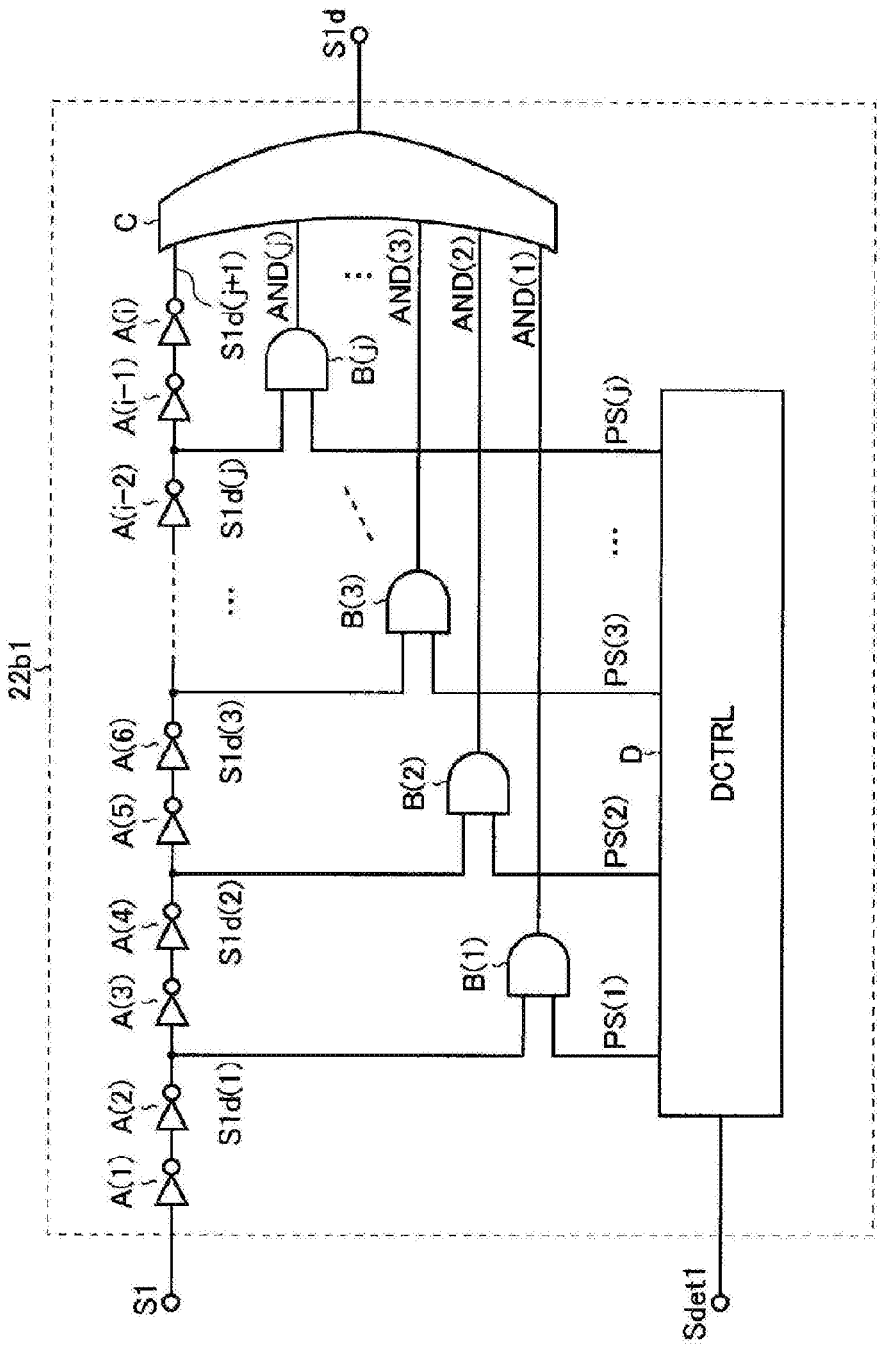
FIG. 3 is a block diagram illustrating a configuration example of a delay part 22b1.

FIG. 3 is a block diagram illustrating a configuration example of the delay part 22b1. The delay part 22b1 of this configuration example includes inverters A(1) to A(i) (where i is an even number of 4 or greater), AND operators B(1) to B(j) (where j=(i/2)−1), an OR operator C, and a delay amount control part D.

The inverters A(1) to A(i) are an example of a delay stage provided to delay an ON timing of the first output switch 11H, and are connected in series to an input terminal of the reference control signal S1. A delayed signal S1d(q) (where q=1, 2, 3, ..., j, j+1) is output from an output terminal (where p=2, 4, 6, ..., i−2, i) of an inverter A(p). When one unit delay time given by a pair of inverters A(p−1) and A(p) is du, a delayed signal S1d(q) is a logic signal obtained by delaying the reference control signal S1 by q unit delay times (=du×q). Specifically, the delayed signal S1d(q) rises to a high level when the q unit delay times (=du×q) has lapsed after the reference control signal S1 rises to a high level, and falls to a low level when the q unit delay times (=du×q) has lapsed after the reference control signal S1 falls to a low level.

The AND operator B(r) (where r=1, 2, 3, ..., j) performs an AND operation on the delayed signal S1d(r) and a path selection signal PS(r) to generate an AND signal AND(r). When the path selection signal PS(r) has a high level, the delayed signal S1d(r) is through-output as the AND signal AND(r). Meanwhile, when the path selection signal PS(r) has a low level, the AND signal AND(r) is fixed to a low level without depending on a logical level of the delayed signal S1d(r). That is, the AND operator B(r) is a mask means for determining whether to deliver the delayed signal S1d(r) to the OR operator C depending on the path selection signal PS(r).

The OR operator C performs an OR operation on the AND signals AND(1) to AND(j) (which correspond to the masked delayed signals S1d(1) to S1d(j)) and the delayed signal S1d(j+1) to generate the delayed reference control signal S1d. The delayed reference control signal S1d has a high level when at least one of the input signals has a high level, and has a low level when all the input signals have a low level.

For example, when the path selection signal PS(1) has a high level and the path selection signals PS(2) to PS(j) have a low level, the delayed signal S1d(1) is through-output as the AND signal AND(1), while the AND signals AND(2) to AND(j) are fixed to a low level. Thus, when one unit delay time du has lapsed after the reference control signal S1 rises to a high level and the AND signal AND(1) (=delayed signal S1d(1)) rises to a high level, the delayed reference control signal S1d rises to a high level. That is, a rising timing of the delayed reference control signal S1d is delayed by one unit delay time (=du) from a rising timing of the reference control signal S1. This state corresponds to a state where an effective stage number of inverters is set to a minimum value (a state where a minimum delay path is selected).

Further, for example, when the path selection signal PS(2) has a high level and the path selection signals PS(1) and PS(3) to PS(j) have a low level, the delayed signal S1d(2) is through-output as the AND signal AND(2), while the AND signals AND(1) and AND(3) to AND(j) are fixed to a low level. Thus, when two unit delay times (=du×2) have lapsed after the reference control signal S1 rises to a high level and the AND signal AND(2) (=delayed signal S1d(2)) rises to a high level, the delayed reference control signal S1d rises to a high level. That is, a rising timing of the delayed reference control signal S1d is delayed by two unit delay times (=du×2) from a rising timing of the reference control signal S1. This state corresponds to a state where the effective stage number of inverters is increased by one step from the minimum value.

This is also the same for a case in which one of the path select signals PS(3) to PS(j) has a high level. As an inverter output of a more subsequent stage is selected, the effective stage number of inverters is increased and a rising timing of the delayed reference control signal S1d is further delayed.

Further, when all the path selection signals PS(1) to PS(j) have a low level, the AND signals AND(1) to AND(j) are fixed to a low level. Thus, when (j+1) unit delay times (=du×(j+1)) have lapsed after the reference control signal S1 rises to a high level and the delayed signal S1d(j+1) rises to a high level, the delayed reference control signal S1d rises to a high level. That is, the rising timing of the delayed reference control signal S1d is delayed by (j+1) unit delay times (=du×(j+1)) from the rising timing of the reference control signal S1. This state corresponds to a state where the effective stage number of inverters is set to a maximum value (a state where a maximum delay path is selected).

In this manner, the AND operators B(1) to B(j) and the OR operator C serve as a stage number switching part for switching the effective stage number of the inverters A(1) to A(i) depending on the path selection signals PS(1) to PS(j).

Meanwhile, when the reference control signal S1 falls from a high level to a low level, the delayed reference control signal S1d is maintained at the high level until all the input signals of the OR operator C have a low level. Thus, a falling timing of the delayed reference control signal S1d does not depend on the path selection signals PS(1) to PS(j) and is always delayed by (j+1) unit delay times (=du×(j+1)) from the falling timing of the reference control signal S1.

The delay amount control part D controls a delay amount (equivalent to an ON timing delay amount of the first output switch 11H) given to the reference control signal S1 by generating the path select signals PS(1) to PS(j) depending on a logic level of the first dead time detection signal Sdet1. More specifically, the delay amount control part D checks a logic level of the first dead time detection signal Sdet1 at every predetermined period, and generates the path selection signals PS(1) to PS(j) to decrease the effective stage number of inverters when the first dead time detection signal Sdet1 has a high level (when the first dead time d1 is longer than a target value) and increase the effective stage number of inverters when the first dead time detection signal Sdet1 has a low level (when the first dead time d1 is shorter than the target value). As the delay amount control part D, for example, an up/down counter that operates in synchronization with the reference control signal S1 may be used.

Figure 4A:
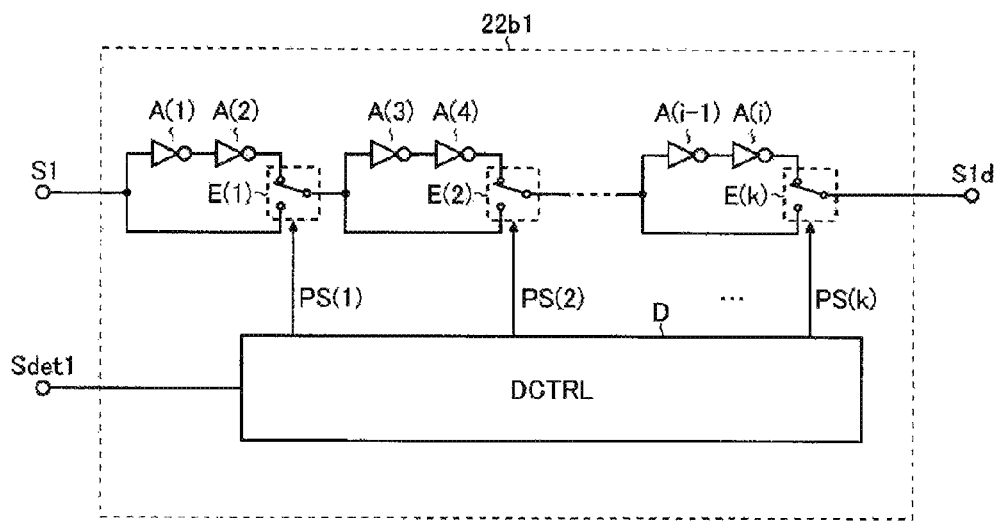
FIGS. 4A and 4B are block diagrams illustrating modifications of the delay part 22b1.
Figure 4B:
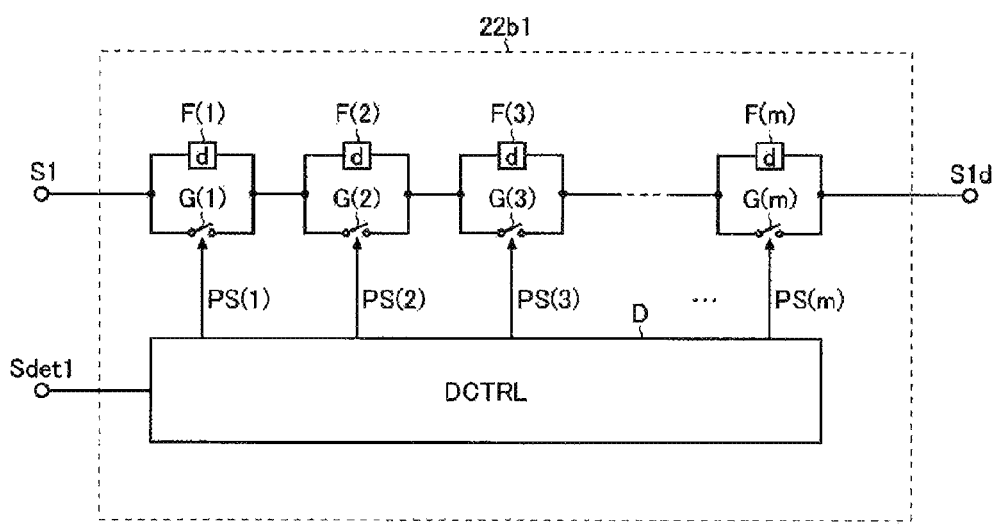

FIGS. 4A and 4B are block diagrams illustrating modifications of the delay part 22b1. The delay part 22b1 of FIG. 4A includes path changeover switches E(1) to E(k) (where k=i/2), instead of the foregoing AND operators B(1) to B(j) and the OR operator C. The path changeover switches E(s) (where s=1, 2 . . . , k) connects one of an input terminal of an inverter A(2s−1) and an output terminal of an inverter A(2s) to an input terminal of an inverter A(2s+1) depending on a path selection signal PS(s). That is, the path changeover switch E(s) selects, depending on the path selection signal PS(s), any one of a first signal path passing through a set of inverters A(2s−1) and A(2s) and a second signal path bypassing the set.

The delay part 22b1 of FIG. 4B includes delay stages F(1) to F(m) instead of the foregoing inverters A(1) to A(i), and short-circuiting switches G(1) to G(m) instead of the foregoing AND operators B(1) to B(j) and the OR operator C. The short-circuiting switch G(t) (where t=1, 2, 3, . . . , m) determines whether to short-circuit both ends of the delay stage F(t) depending on a path selection signal PS(t).

As described above, the delay element for delaying the reference control signal S1 is not limited to inverters and the stage number switching part for switching the effective stage number of the delay element may employ an arbitrary configuration.

Also, in FIGS. 3 to 4B, the delay part 22b1 is described as an example, but a configuration and an operation of the delay part 22b2 are basically the same. That is, in the description of the drawings, the configuration and operation of the delay part 22b2 may be understood by replacing the "reference control signal S1" with an "inverted reference signal S1B", the "first dead time detection signal Sdet1" with a "second dead time detection signal Sdet2", the "delayed signals S1d(1) to S1d(j+1)" with "delayed signals S2d(1) to S2d(j+1)", and the "delayed reference control signal S1d" with a "delayed inverted reference control signal S1Bd".

<Dead Time Providing Operation>

Figure 5:
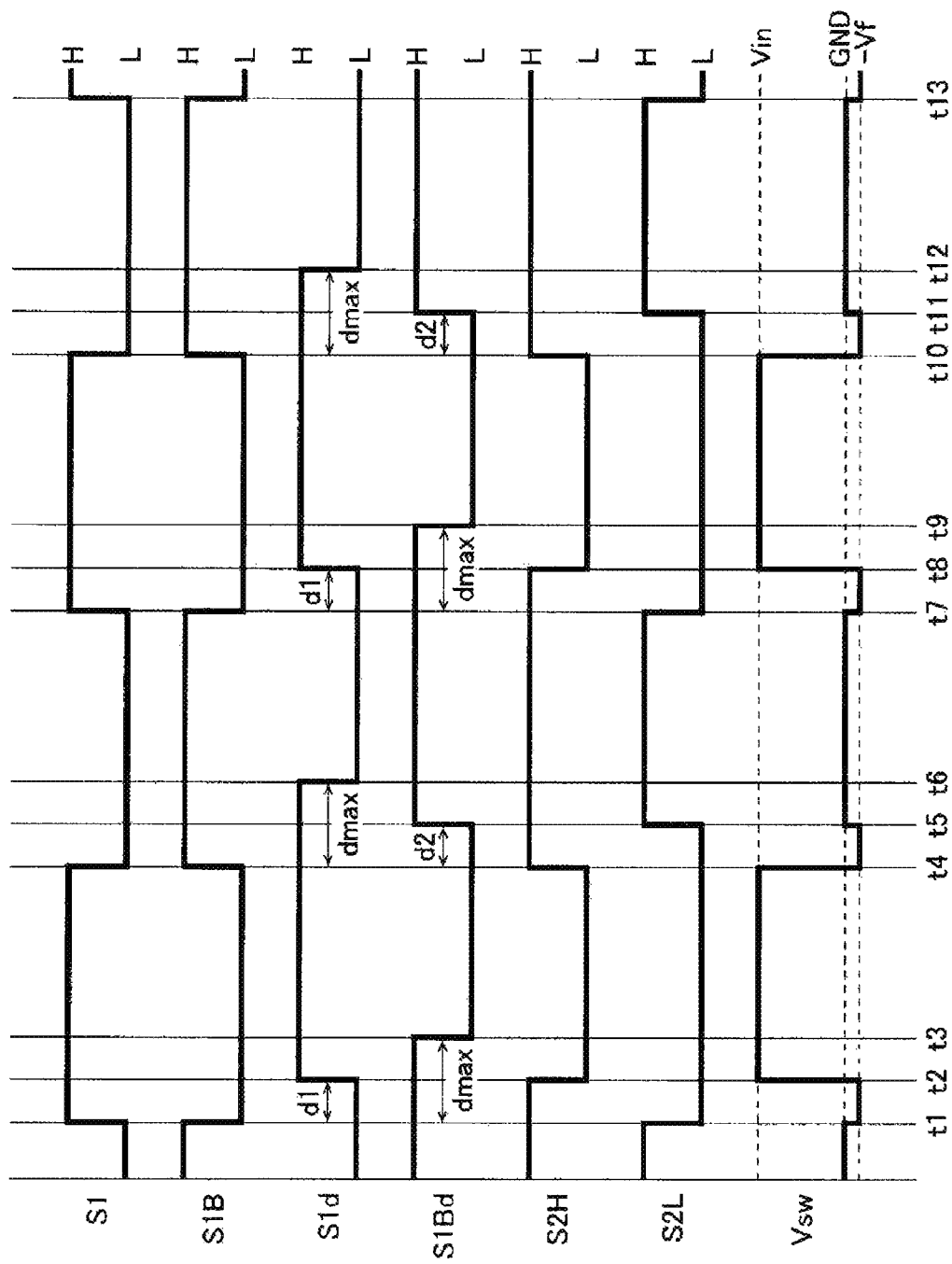
FIG. 5 is a timing chart illustrating an example of a dead time providing operation.

FIG. 5 is a timing chart illustrating an example of a dead time providing operation, in which the reference control signal S1, the inverted reference control signal S1B, the delayed reference control signal S1d, the delayed inverted reference control signal S1Bd, the first control signal S2H, the second control signal S2L, and the switch voltage Vsw are illustrated in this order from above. Also, the dead time providing operation of this drawing is performed by the delay parts 22b1 and 22b2 employing the configuration of FIG. 3.

At a time t1, when the reference control signal S1 rises to a high level, the inverted reference control signal S1B falls to a low level without any delay. Meanwhile, the delayed reference control signal S1d is maintained at a low level until a first dead time d1 (du≤d1≤du×(j+1)) set by the delay part 22b1 has lapsed after the reference control signal S1 rises to a high level. Further, the delayed inverted reference control signal S1Bd is maintained at a high level until a maximum delay time dmax (=du×(j+1)) of the delay part 22b2 has lapsed after the inverted reference control signal S1B falls to a low level.

When the inverted reference control signal S1B falls to a low level, the second control signal S2L also falls to a low level without any delay, and thus, the second output switch 11L is turned off. Meanwhile, at the time t1, since the delayed reference control signal S1d is maintained at a low level, the first control signal S2H does not fall to a low level and the first output switch 11H is kept turned off. As a result, both of the first output switch 11H and the second output switch 11L are in the turned-off state. At this time, a current flows in a parasitic diode accompanied by the second output switch 11L from the ground terminal toward the output inductor 12. Thus, the switch voltage Vsw is lowered to a negative voltage (=−Vf) obtained by subtracting a forward drop voltage Vf of the parasitic diode from the ground voltage GND (=0 V).

At a time t2 with the lapse of the first dead time d1 from the time t1, when the delayed reference control signal S1d rises to a high level, the first control signal S2H falls to a low level, and thus, the first output switch 11H is turned on. As a result, the switch voltage Vsw rises to almost the input voltage Vin.

Further, at a time t3 with the lapse of the maximum delay time dmax from the time t1, the delayed inverted reference control signal S1B falls to a low level. However, at this time, since the second control signal S2L has already fallen to a low level, the ON/OFF state of the second output switch 11L is not changed.

Thereafter, at a time t4, when the reference control signal S1 falls to a low level, the inverted reference control signal S1B rises to a high level without any delay. Meanwhile, the delayed reference control signal S1d is maintained at a high level until the maximum delay time dmax (=du×(j+1)) of the delay part 22b1 has lapsed after the reference control signal S1 falls to a low level. Also, the delayed inverted reference control signal S1Bd is maintained at a low level until a second dead time d2 (du≤d2≤du×(j+1)) set by the delay part 22b2 has lapsed after the inverted reference control signal S1B rises to a high level.

When the reference control signal S1 falls to a low level, since the first control signal S2H rises to a high level without any delay, the first output switch 11H is turned off. Meanwhile, at the time t4, since the delayed inverted reference control signal S1Bd is maintained at a low level, the second control signal S2L does not rise to a high level and the second output switch 11L is kept turned off. As a result, both of the first output switch 11H and the second output switch 11L are in the turned-off state. At this time, a current flows in the parasitic diode accompanied by the second output switch 11L from the ground terminal toward the output inductor 12. Thus, the switch voltage Vsw is lowered to a negative voltage (=−Vf) obtained by subtracting the forward drop voltage Vf of the parasitic diode from the ground voltage GND (=0 V).

At a time t5 with the lapse of the second dead time d2 from the time t4, when the delayed inverted reference control signal S1Bd rises to a high level, the second control signal S2L also rises to a high level, and thus, the second output switch 11L is turned on. As a result, the parasitic diode accompanied by the second output switch 11L is bypassed and the switch voltage Vsw rises to almost the ground voltage GND.

At a time t6 with the lapse of the maximum delay time dmax from the time t4, the delayed reference control signal S1d falls to a low level. However, at this time, since the first control signal S2H has already risen to a high level, the ON/OFF state of the first output switch 11H is not changed.

Even after a time t7, the dead time providing operation is repeated in the same manner according to the above-described series of signal generation processing.

As described above, the dead time adjusting circuit 22 generates the first control signal S2H by logically synthesizing the reference control signal S1 and the delayed reference control signal Sd1 such that the first output switch 11H is turned on after the lapse of the first dead time d1 after the second output switch 11L is turned off. The dead time adjusting circuit 22 generates the second control signal S2L by logically synthesizing the inverted reference control signal S1B and the delayed inverted reference control signal S1Bd such that the second output switch 11L is turned on after the lapse of the second dead time d2 after the first output switch 11H is turned off.

With this configuration, when the first output switch 11H and the second output switch 11L are complementarily turned on and off, it is possible to prevent the generation of a through current by avoiding simultaneous ON of the two switches.

<Dead Time Detecting Part>

Figure 6:
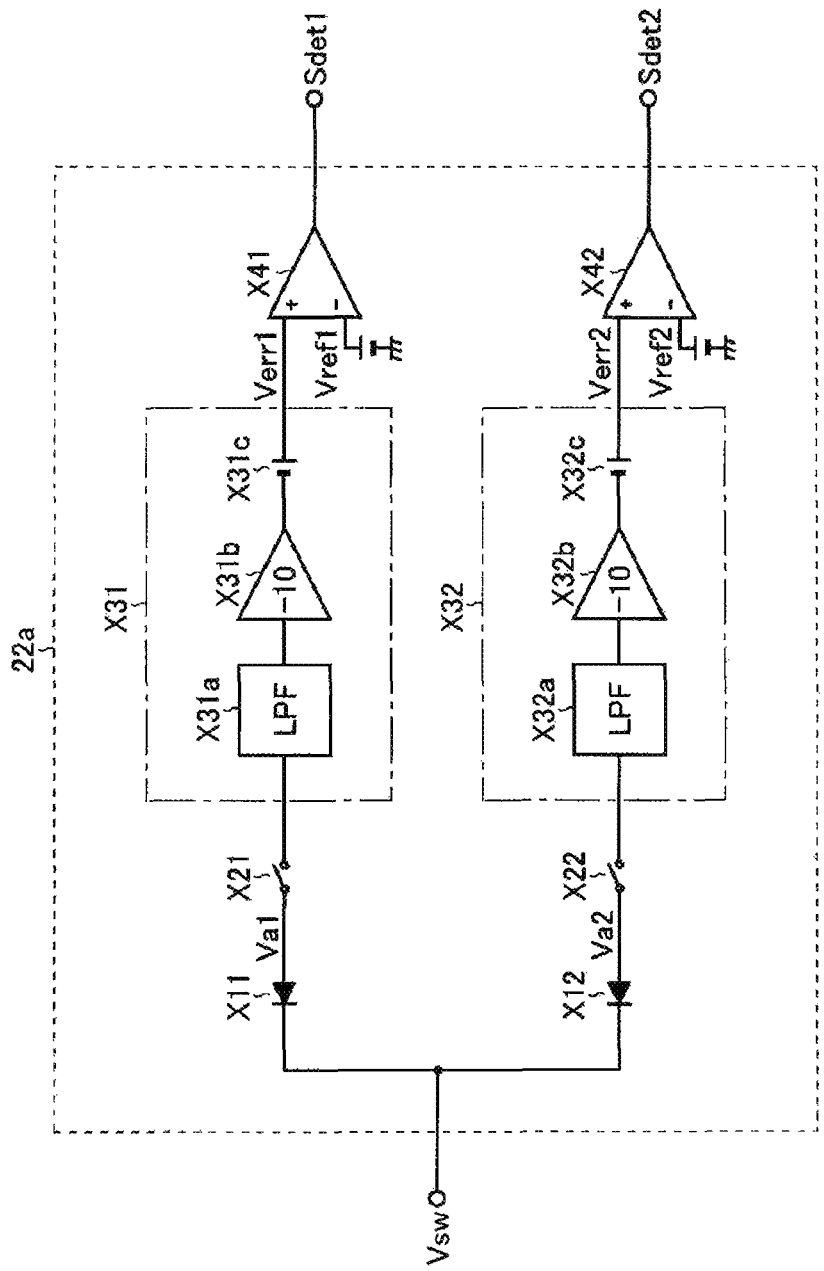

FIG. 6 is a block diagram illustrating a configuration example of the dead time detecting part 22a. The dead time detecting part 22a of this configuration example includes a first diode X11 and a second diode X12, a first detection switch X21 and a second detection switch X22, a first integration part X31 and a second integration part X32, and a first comparator X41 and a second comparator X42.

The first diode X11 is a back flow preventing element for blocking a current path from the application terminal of the switch voltage Vsw to the first integration part X31. Explaining a connection relationship thereof in detail, a cathode of the first diode X11 is connected to the application terminal of the switch voltage Vsw. An anode of the first diode X11 is connected to an input terminal of the first integration part X31 through the first detection switch X21.

The second diode X12 is a back flow preventing element for blocking a current path from the application terminal of the switch voltage Vsw to the second integration part X32. Explaining a connection relationship thereof in detail, a cathode of the second diode X12 is connected to the application terminal of the switch voltage Vsw. An anode of the second diode X12 is connected to an input terminal of the second integration part X32 through the second detection switch X22.

The first detection switch X21 is a switch element for conducting/blocking between the anode of the first diode X11 and the input terminal of the first integration part X31. The first detection switch X21 is turned on at least between a time at which the second output switch 11L is turned off and a time at which the first output switch 11H is turned on (i.e., during the first dead time d1), and is turned off at least between a time at which the first output switch 11H is turned off and a time at which the second output switch 11L is turned on (i.e., during the second dead time d2).

The second detection switch X22 is a switch element for conducting/blocking between the anode of the second diode X12 and the input terminal of the second integration part X32. The second detection switch X22 is turned on at least between a time at which the first output switch 11H is turned off and a time at which the second output switch 11L is turned on (i.e., during the second dead time d2), and is turned off at least between a time at which the second output switch 11L is turned off and a time at which the first output switch 11H is turned on (i.e., during the first dead time d1).

The first integration part X31 is a circuit block for integrating a first anode voltage Va1 appearing at the anode of the first diode X11 to generate a first error voltage Verr1, and includes a first low pass filter part X31a, a first inverting amplifying part X31b, and a first offset part X31c. The first low pass filter part X31a dampens the first anode voltage Va1 with a first time constant $\tau 1$. The first inverting amplifying part X31b inverting-amplifies an output from the first low pass filter part X31a with a first gain $\alpha 1$. The first offset part X31c provides a first offset Vofs1 to an output from the first inverting amplifying part X31b to generate a first error voltage Verr1. The first error voltage Verr1 is increased as the first dead time d1 is lengthened.

The second integration part X32 is a circuit block for integrating a second anode voltage Va2 appearing at the anode of the second diode X12 to generate a second error voltage Verr2, and includes a second low pass filter part X32a, a second inverting amplifying part X32b, and a second offset part X32c. The second low pass filter part X32a dampens the second anode voltage Va2 with a second time constant $\tau 2$. The second inverting amplifying part X32b inverting-amplifies an output from the second low pass filter part X32a with a second gain $\alpha 2$. The second offset part X32c provides a second offset Vofs2 to an output from the second inverting amplifying part X32b to generate a second error voltage Verr2. The second error voltage Verr2 is increased as the second dead time d2 is lengthened.

The first comparator X41 compares the first error voltage Verr1 input to a non-inverting input terminal (+) with a first reference voltage Vref1 input to an inverting input terminal (−) to generate the first dead time detection signal Sdet1. The first dead time detection signal Sdet1 has a high level when the first error voltage Verr1 is higher than the first reference voltage Vref1, and reversely, has a low level when the first error voltage Verr1 is lower than the first reference voltage Vref1.

The second comparator X42 compares the second error voltage Verr2 input to a non-inverting input terminal (+) with a second reference voltage Vref2 input to an inverting input terminal (−) to generate the second dead time detection signal Sdet2. The second dead time detection signal Sdet2 has a high level when the second error voltage Verr2 is higher than the second reference voltage Vref2, and reversely, has a low level when the second error voltage Verr2 is lower than the second reference voltage Vref2.

In particular, the dead time detecting part 22a of this configuration example generates the first dead time detection signal Sdet1 and the second dead time detection signal Sdet2 by monitoring the switch voltage Vsw. With this configuration, the first dead time d1 and the second dead time d2 can be directly detected, compared with an existing configuration in which the first driving signal S3H and the second driving signal S3L are monitored. Thus, even when the switching frequency fsw is relatively high (for example, fsw=20 MHz), it is possible to adjust the first dead time d1 and the second dead time d2 to respective desired values (for example, a few ns).

<Integration Part>

Figure 7:
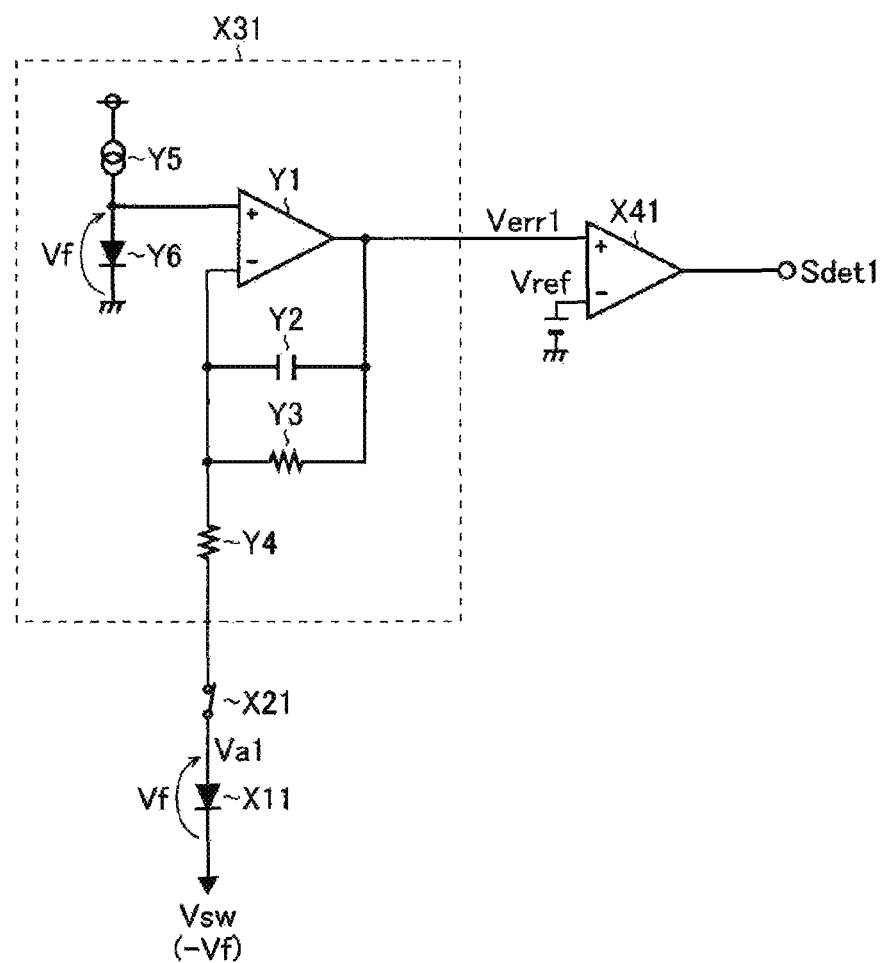
FIG. 7 is a circuit diagram illustrating a configuration example of a first integration part X31.

FIG. 7 is a circuit diagram illustrating a configuration example of the first integration part X31. The first integration part X31 of this configuration example includes an operational amplifier Y1, a capacitor Y2, resistors Y3 and Y4, a current source Y5, and a diode Y6.

The operational amplifier Y1 outputs the first error voltage Verr1 from an output terminal such that a non-inverting input terminal (+) and an inverting input terminal (−) are imaginary-shorted. The capacitor Y2 and the resistor Y3 are connected in parallel between the inverting input terminal (−) and the output terminal of the operational amplifier Y1. The resistor Y4 is connected between the inverting input terminal (−) of the operational amplifier Y1 and the first detection switch X21. The current source Y5 is connected between the power source terminal and the non-inverting input terminal (+) of the operational amplifier Y1. An anode of the diode Y6 is connected to the non-inverting input terminal (+) of the operational amplifier Y1. A cathode of the diode Y6 is connected to a ground terminal.

The capacitor Y2 and the resistor Y4 correspond to the first low pass filter part X31a. The operational amplifier Y1 and the resistors Y3 and Y4 correspond to the first inverting amplifying part X31b. The current source Y5 and the diode Y6 correspond to the first offset part X31c.

In the first integration part X31 having the foregoing configuration, the forward drop voltage Vf of the diode Y6 is applied to the non-inverting input terminal (+) of the operational amplifier Y1. Thus, a negative feedback is applied in the operational amplifier Y1 such that an application voltage of the inverting input terminal (−) is identical to the forward drop voltage Vf. Also, at the first dead time d1 at which the detection switch X21 is turned on, the switch voltage Vsw applied to the cathode of the first diode X11 is a negative voltage (=−Vf) obtained by subtracting the forward drop voltage Vf of a parasitic diode accompanied by the second output switch 11L from the ground voltage GND (=0 V). Thus, the first anode voltage Va (=Vsw+Vf) drawn from the anode of the first diode X11 is equal to the ground voltage GND (=0 V). As a result, in the first integration part X31, the first error voltage Verr1 (=a voltage signal in proportion to time integration of the forward drop voltage Vf) which depends on a length of the first dead time d1 is generated.

Although the first integration part X31 is described as an example in FIG. 7, the configuration and the operation of the second integration part X32 are basically the same. That is, in the second integration part X32, the second error voltage Verr2 (=a voltage signal in proportion to time integration of the forward drop voltage Vf) depends on a length of the second dead time d2 is generated.

<Dead Time Adjusting Operation>

Figure 8:
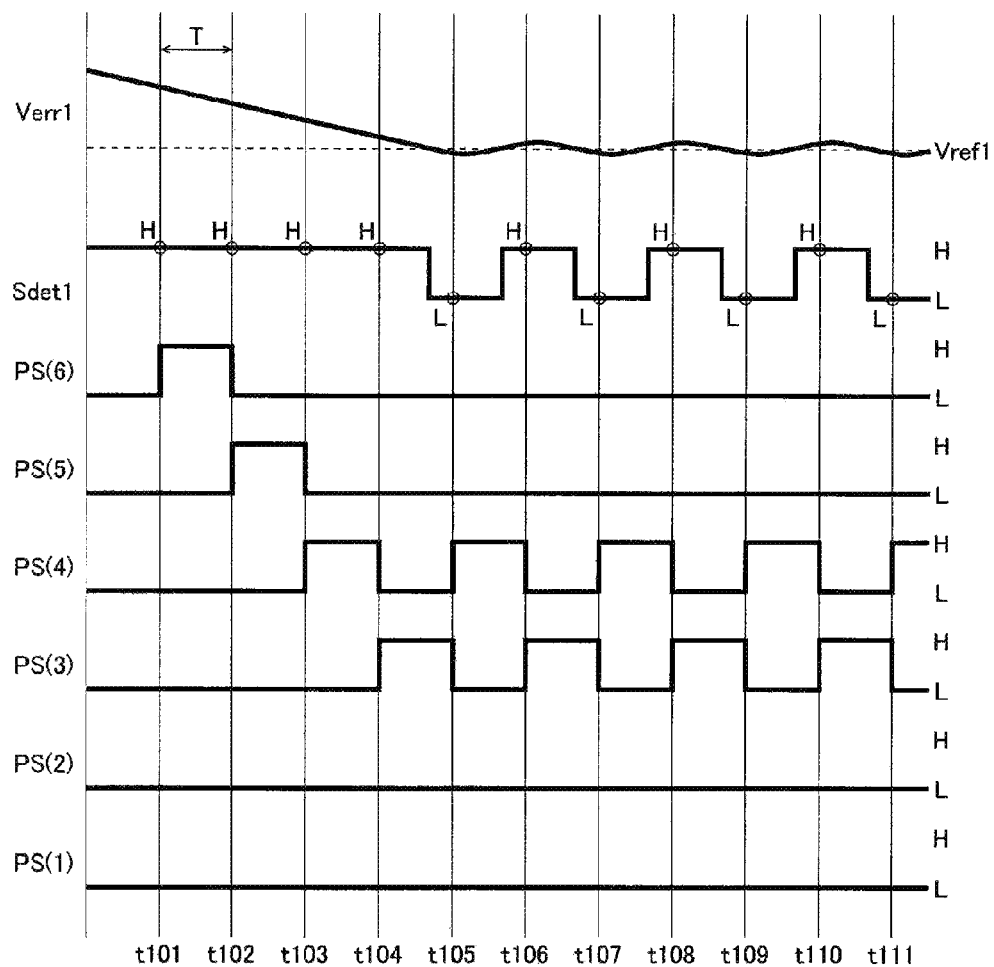
FIG. 8 is a timing chart illustrating an example of a dead time adjusting operation.
Figure 9:
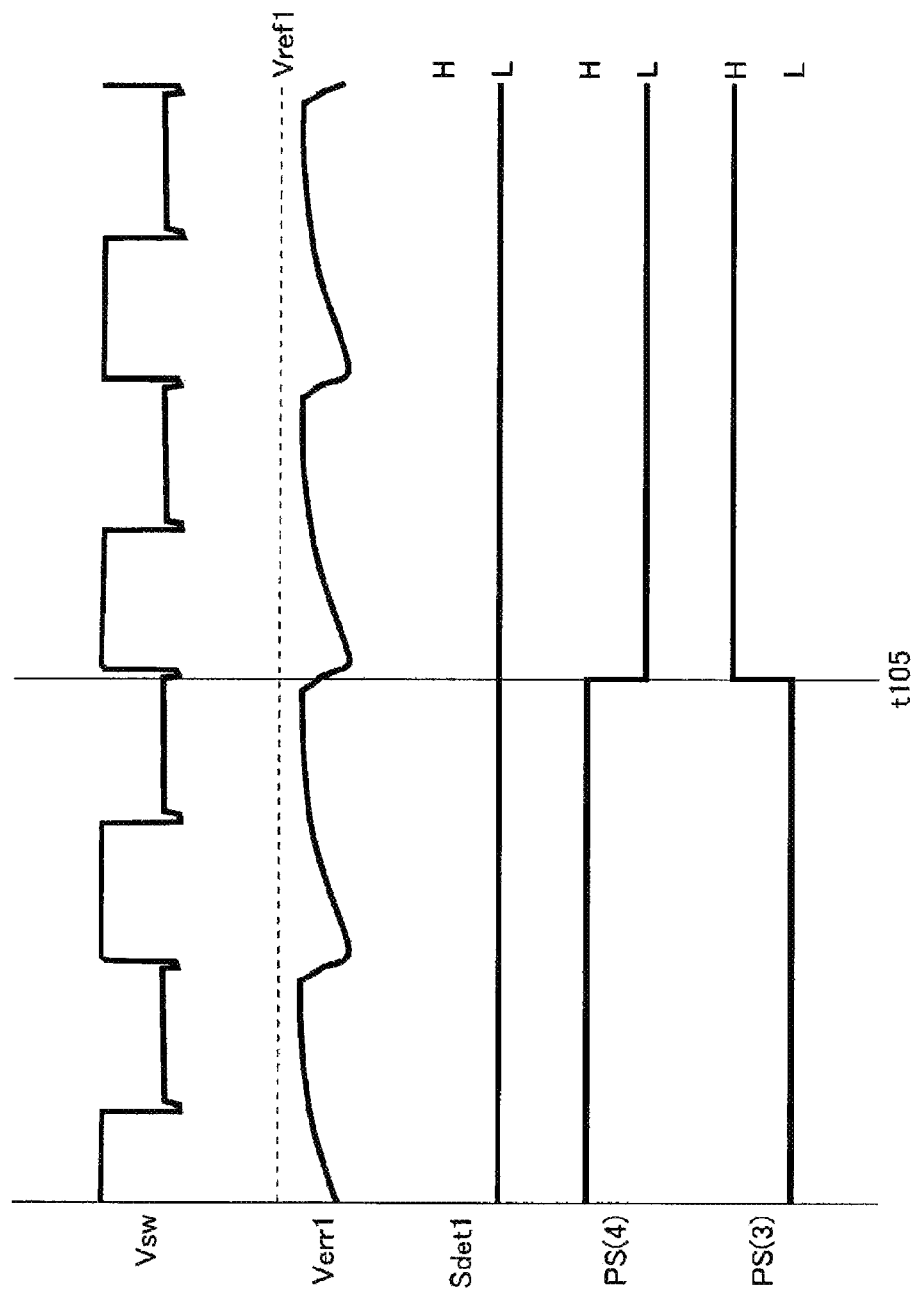
FIG. 9 is a partial enlarged view in the vicinity of a time t105.

FIG. 8 is a timing chart illustrating an operation of adjusting the first dead time d1 by the delay part 22b1, in which the first error voltage Verr1, the first dead time detection signal Sdet1, and the path selection signals PS(6) to PS(1) are illustrated in this order from above. FIG. 9 is a partial enlarged view in the vicinity of a time t105, in which the switch voltage Vsw, the first error voltage Verr1, the first dead time detection signal Sdet1, and the path selection signals PS4 and PS(3) are illustrated in this order from above. The dead time adjusting operations of these two drawings correspond to a case in which the configuration (j=6) of FIG. 3 is employed as the delay part 22b1.

Before a time t101, the delay amount control part D (see FIG. 3) of the delay part 22b1 adjusts all the path selection signals PS(1) to PS(6) to a low level prior to the operation of adjusting the first dead time d1. This state corresponds to a state where an effective stage number of inverters is set to a maximum value (a state where a maximum delay path is selected). That is, the operation of adjusting the first dead time d1 is started in a state where the first dead time d1 is set to a maximum value. Thus, it is possible to reliably prevent simultaneous ON of the first output switch 11H and the second output switch 11L.

Each of times t101 to t111 corresponds to a logic level check timing of the first dead time detection signal Sdet1 by the delay amount control part D. Also, an interval between the times t101 to t111 is set to a predetermined period T.

At the time t101, since the first error voltage Verr1 is higher than the first reference voltage Vref1, the first dead time detection signal Sdet1 has a high level. At this time, the delay amount control part D generates the path selection signals PS(1) to PS(6) such that the effective stage number of inverters is decreased by one stage. Specifically, only the path selection signal PS(6) has a high level and all of the other path selection signals have a low level. As a result, since the first dead time d1 is shortened by one step, the first error voltage Verr1 is lowered.

At the time t102, since the first error voltage Verr1 is still higher than the first reference voltage Vref1, the first dead time detection signal Sdet1 has a high level. At this time, the delay amount control part D generates the path selection signals PS(1) to PS(6) such that the effective stage number of inverters is further decreased by one stage. Specifically, only the path selection signal PS(5) has a high level and all of the other path selection signals have a low level. As a result, since the first dead time d1 is further shortened by one step, the first error voltage Verr1 is further lowered.

Even at the times t103 and t104, the first error voltage Verr1 is not below the first reference voltage Vref1 and the first dead time detection signal Sdet1 is maintained at a high level. Thus, the delay amount control part D generates the path selection signals PS(1) to PS(6) to further decrease the effective stage number of inverters by one stage each time. Specifically, at the time t103, only the path selection signal PS(4) has a high level, and at the time t104, only the path selection signal PS(3) has a high level. As a result, since the first dead time d1 is successively reduced, the first error voltage Verr1 is further lowered.

At the time t105, since the first error voltage Verr1 is lower than the first reference voltage Vref1, the first dead time detection signal Sdet1 has a low level. At this time, the delay amount control part D generates the path selection signals PS(1) to PS(6) to increase the effective stage number of inverters by one stage. Specifically, only the path selection signal PS(4) has a high level, and all of the other path selection signals have a low level. As a result, since the first dead time d1 is lengthened by one step, the first error voltage Verr1 is switched to be increased.

At the time t106, since the first error voltage Verr1 is again above the first reference voltage Vref1, the first dead time detection signal Sdet1 has a high level. At this time, the delay amount control part D generates the path selection signals PS(1) to PS(6) to reduce the effective stage number of inverters by one stage. Specifically, only the path selection signal PS(3) has a high level, and all of the other path selection signals have a low level. As a result, since the first dead time d1 is shortened by one step, the first error voltage Verr1 is switched back to be lowered.

Even after the time t107, the delay amount control part D appropriately generates the path selection signals PS(1) to PS(6) depending on the logic level of the first dead time detection signal Sdet1. As a result, the first error voltage Verr1 converges on the first reference voltage Vref1, and further, the first dead time d1 can be adjusted to a target value.

If the interval (=period T) for checking the logic level of the first dead time detection signal Sdet1 is too short, a high level and a low level of the first dead time detection signal Sdet1 are alternately detected multiple times in a converged state of the first dead time d1 (in a state where the first error voltage Verr1 repeatedly fluctuates above and below the first reference voltage Vref1), increasing a fluctuation ripple of the first dead time d1.

Thus, the period T may be set to an appropriate length (for example, T≥3τ to T≥4τ, where i is a time constant of the low pass filter part X31a) such that the high level and the low level of the first dead time detection signal Sdet1 are basically switched by one time in the converged state of the first dead time d1.

Although the operation of adjusting the first dead time d1 by the delay part 22b1 is described as an example in FIGS. 8 and 9, an operation of adjusting the second dead time d2 by the delay part 22b2 is basically the same as described above. That is, in the description of FIGS. 8 and 9, the operation of adjusting the second dead time d2 by the delay part 22b2 may be understood by replacing the "first error voltage Verr1" with the "second error voltage Verr2", the "first reference voltage Vref1" with the "second reference voltage Vref2", and the "first dead detection signals Sdet1" with the "second dead detection signal Sdet2".

<Applications to Electronic Device>

Figure 10:
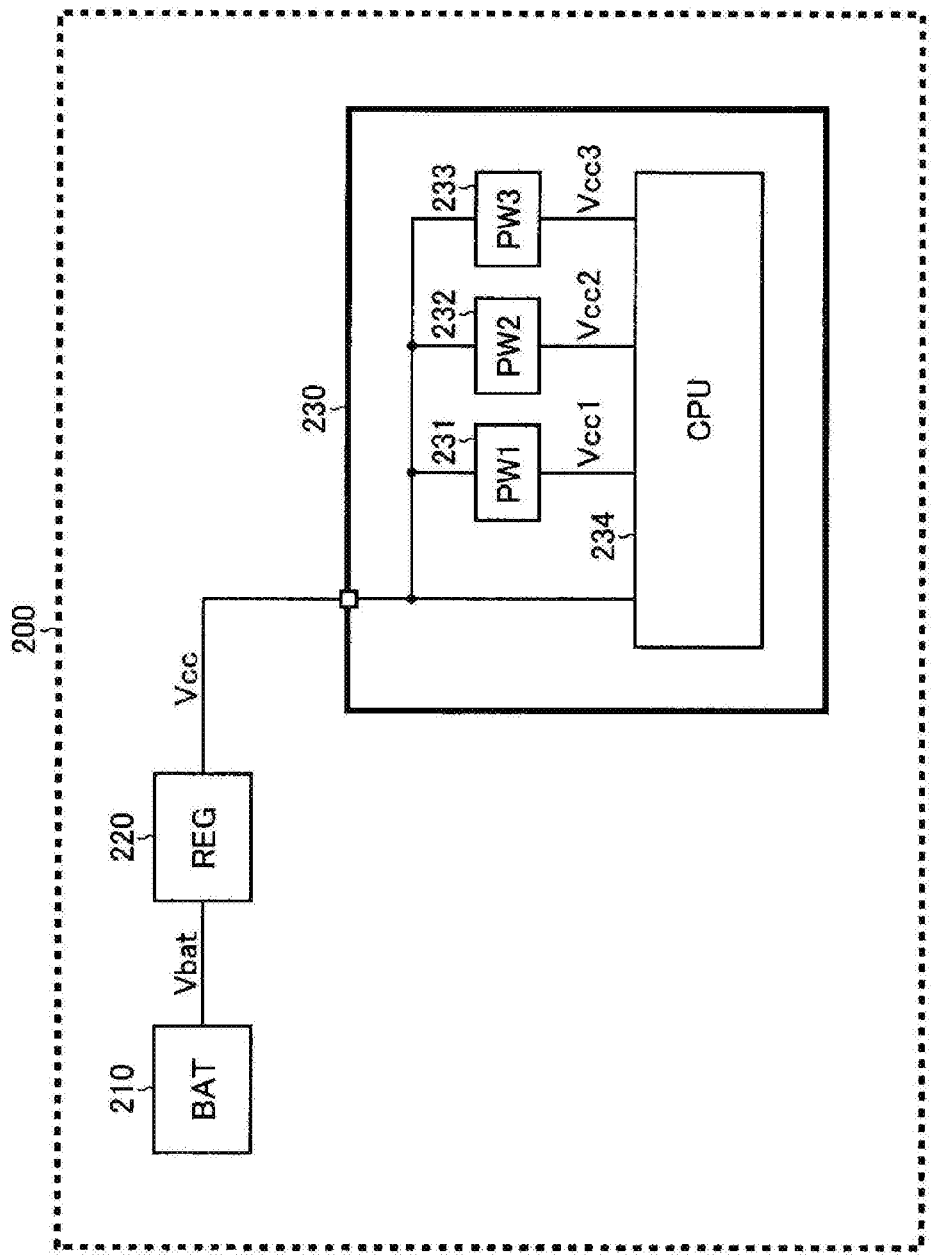
FIG. 10 is a block diagram illustrating a configuration example of an electronic device 200.

FIG. 10 is a block diagram illustrating a configuration example of an electronic device 200. In this configuration example, the electronic device 200 includes a battery 210, a regulator 220, and a central processing unit (CPU) package 230.

The battery 210 is a power source of the electronic device 200, and for example, a lithium ion secondary battery or the like may be appropriately used as the battery 210.

The regulator 220 converts a battery voltage Vbat supplied from the battery 210 into an external source voltage Vcc (e.g., 3.3 V) and supplies the converted voltage to the CPU package 230.

The CPU package 230 is a multi-chip type package including a plurality of (three in FIG. 10) power chips 231 to 233 and a CPU chip 234.

The power chips 231 to 233 generate internal source voltages Vcc1 to Vcc3 (e.g., 1.8 V, 1.5 V, and 1.2 V) from the external source voltage Vcc, respectively, and supply the generated internal source voltages Vcc1 to Vcc3 to each part of the CPU chip 234.

The CPU chip 234 operates with the external source voltage Vcc and the internal source voltages Vcc1 to Vcc3, and generally controls an overall operation of the electronic device 200.

Here, as described above, research into the switching power supply device 100 has been actively conducted so as not to disrupt its output operation even though the switching frequency fsw is increased to reduce the circuit size. Thus, when the switching power supply device 100 is embedded as the power chips 231 to 233, the plurality of power chips 231 to 233 can be installed within the single CPU package 230, without unnecessarily increasing the package size.

In the case of using the CPU package 230 equipped with the plurality of power chips 231 to 233 as described above, it is unnecessary to receive power from a plurality of systems when driving the CPU package 230. Thus, since it is unnecessary to prepare a plurality of regulators at the outside of the CPU package 230, the electronic device 200 can be reduced in size.

Further, although the power chips 231 to 233 and the CPU chip 234 are separate chips in this configuration example, it is possible to further shrink the CPU package 230 by integrating these chips into a single chip.

Figure 11:
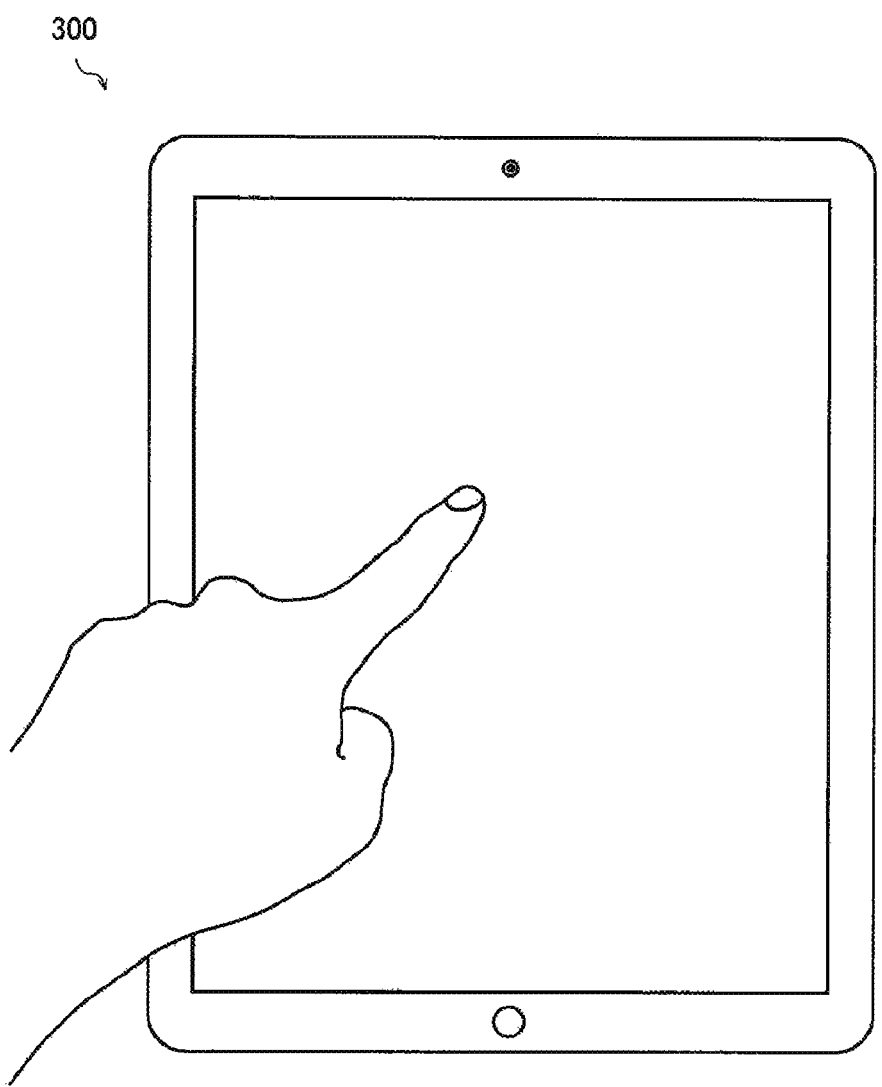
FIG. 11 is a view illustrating an exterior appearance of a table terminal 300.

FIG. 11 is a view illustrating an exterior appearance of a tablet terminal 300. The tablet terminal 300 is a specific example of the above-described electronic device 200. The tablet terminal 300, which significantly needs to be reduced in weight and thickness, is appropriate as a target in which the switching power supply device 100 is to be installed.

<Other Modifications>

Figure 12A:
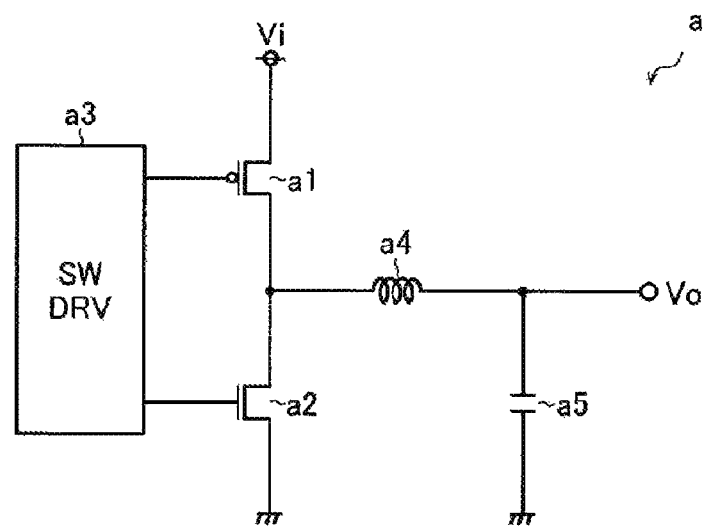
FIGS. 12A to 12C are views illustrating application examples of the present disclosure.
Figure 12B:
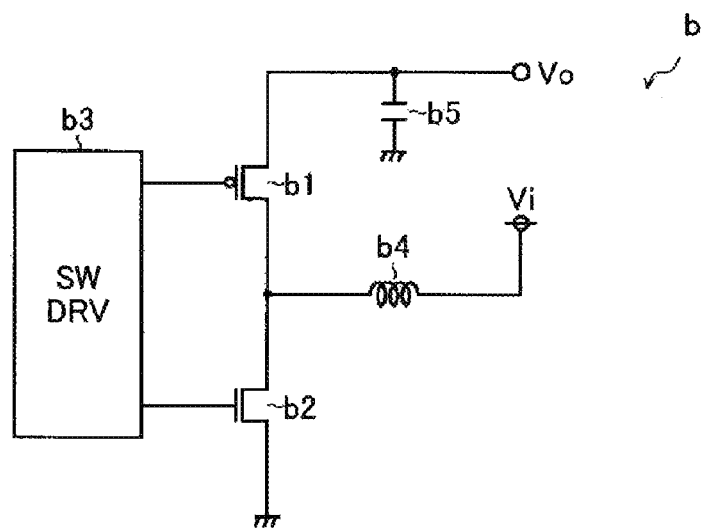
Figure 12C:
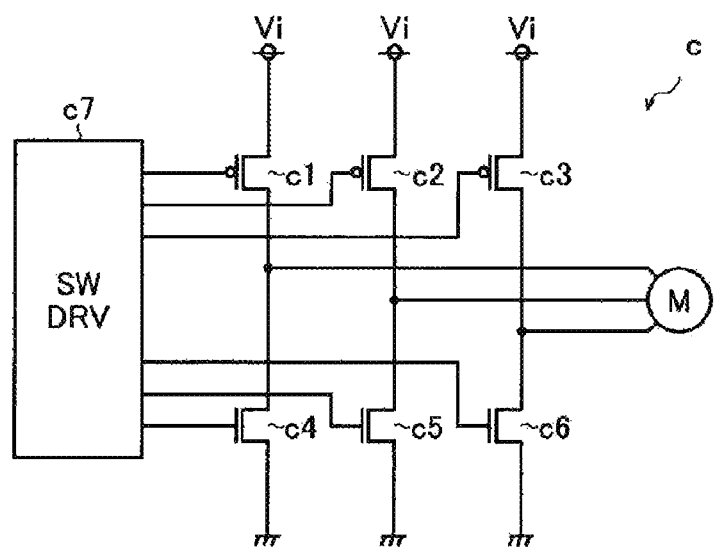

FIGS. 12A to 12C are views illustrating application examples of the present disclosure. As mentioned in the foregoing embodiments, the present disclosure may be applied to a step-down switching regulator a (see FIG. 12A) which drives a switch output stage to step down an input voltage and generate an output voltage.

However, the application target of the present disclosure is not limited thereto and the present disclosure may be generally applied to a synchronous rectifying type switching regulator (for example, a step-up switching regulator b (see FIG. 12B) which drives a switch output stage to step up an input voltage and generate an output voltage), and may also be applied to a motor driver c (see FIG. 12C) which drives a switch output stage to supply a driving current to a motor.

In addition, various electronic devices (for example, a smartphone or a personal computer as a target in which the switching power device a or b is installed, vehicle equipment as a target in which the motor driving device c is installed, etc.) other than the tablet terminal (FIG. 11) may also be application targets of the present disclosure.

Various technical features disclosed herein may be variously modified, in addition to the foregoing embodiments, without departing from the spirit of the present disclosure. For example, mutual substitution of bipolar transistors and MOSFETs, and a logic level inversion of various signals are arbitrary. That is, it should be understood that the aforementioned embodiments are merely illustrative and not intended to limit the scope of the present disclosure in all aspects. The technical scope of the present disclosure is presented by claims, rather than the description of the embodiments, and thus, is to be understood to encompass all changes that fall within the meaning and range equivalent to the scope of the claims.

The present disclosure can be generally and widely used, for example, in a switch driving circuit for complementarily turning on and off a first output switch and a second switch connected in series between two different potentials.

According to the present disclosure in some embodiments, it is possible to provide a dead time adjusting circuit capable of appropriately adjusting a dead time.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A dead time adjusting circuit, wherein a switch voltage appearing at a connection node between a first output switch and a second output switch, which are connected in series between two different potentials, is monitored to detect a first dead time, which is from a time at which the second output switch is turned off to a time at which the first output switch is turned on, and a second dead time, which is from a time at which the first output switch is turned off to a time at which the second output switch is turned on, each of the first and second dead times being feedback-controlled to be identical to a predetermined target value, wherein the dead time adjusting circuit comprises
a dead time detecting part configured to monitor the switch voltage to generate first and second dead time detection signals indicating whether the first and second dead times are longer than the target value; and
a delay part configured to increase and decrease ON timing delay amounts of the first and second output switches depending on the first and second dead time detection signals, wherein the delay part includes:
a delay element having a plurality of stages and configured to delay ON timings of the first and second output switches;
a stage number switching part configured to switch an effective stage number of the delay element and
a delay amount control part configured to control the stage number switching part depending on the first and second dead time detection signals to control the ON timing delay amounts of the first and second output switches, and wherein the delay amount control part is configured to control the stage number switching part to check logic levels of the first and second dead time detection signals at every predetermined period, decrease the effective stage number of the delay element when the first and second dead times are longer than the target value, and increase the effective stage number of the delay element when the first and second dead times are shorter than the target value.

2. The dead time adjusting circuit of claim 1, wherein the dead time detecting part comprises:
first and second diodes, each of the first and second diodes having a cathode connected to an application terminal of the switch voltage;
first and second integration parts configured to integrate anode voltages of the first and second diodes to generate first and second error voltages, respectively;
first and second detection switches configured to conduct and block between the first and second diodes and the first and second integration parts, respectively; and
first and second comparators configured to compare the first and second error voltages with predetermined reference voltages to generate the first and second dead time detection signals.

3. The dead time adjusting circuit of claim 2, wherein each of the first and second integration parts comprises:
an operational amplifier configured to output the first or second error voltage from an output terminal;
a capacitor connected between an inverting input terminal and the output terminal of the operational amplifier;
a first resistor connected between the inverting input terminal and the output terminal of the operational amplifier;
a second resistor connected between the inverting input terminal of the operational amplifier and the first or second detection switch;
a current source connected between a power source and a non-inverting input terminal of the operational amplifier; and
a diode having an anode connected to the non-inverting input terminal of the operational amplifier and a cathode connected to a ground terminal.

4. A switch driving circuit, comprising:
a control circuit configured to generate a reference control signal;
the dead time adjusting circuit of claim 1 configured to give a delay to the reference control signal to generate first and second control signals; and
a driver circuit configured to generate first and second driving signals from the first and second control signals, respectively, and supply the generated first and second driving signals to the first and second output switches.

5. A switching power supply device, comprising:
a switch output stage including first and second output switches; and
the switch driving circuit of claim 4 configured to drive the switch output stage,
wherein the switch output stage is driven to generate an output voltage from an input voltage.

6. A motor driving device, comprising:
a switch output stage including first and second output switches; and
the switch driving circuit of claim 4 configured to drive the switch output stage,
wherein the switch output stage is driven to supply a driving current to a motor.

7. An electronic device comprising a switching power supply device comprising:
a switch output stage including first and second output switches; and
the switch driving circuit of claim 4 configured to drive the switch output stage,
wherein the switch output stage is driven to generate an output voltage from an input voltage.

8. An electronic device comprising a motor driving device comprising:
a switch output stage including first and second output switches; and
the switch driving circuit of claim 4 configured to drive the switch output stage,
wherein the switch output stage is driven to supply a driving current to a motor.

9. A dead time adjusting circuit, wherein a switch voltage appearing at a connection node between a first output switch and a second output switch, which are connected in series between two different potentials, is monitored to detect a first dead time, which is from a time at which the second output switch is turned off to a time at which the first output switch is turned on, and a second dead time, which is from a time at which the first output switch is turned off to a time at which the second output switch is turned on, each of the first and second dead times being feedback-controlled to be identical to a predetermined target value, the dead time adjusting circuit comprising:
  a dead time detecting part configured to monitor the switch voltage to generate first and second dead time detection signals indicating whether the first and second dead times are longer than the target value; and
  a delay part configured to increase and decrease ON timing delay amounts of the first and second output switches depending on the first and second dead time detection signals,
  wherein the dead time detecting part comprises:
    first and second diodes, each of the first and second diodes having a cathode connected to an application terminal of the switch voltage;
    first and second integration parts configured to integrate anode voltages of the first and second diodes to generate first and second error voltages, respectively;
    first and second detection switches configured to conduct and block between the first and second diodes and the first and second integration parts, respectively; and
    first and second comparators configured to compare the first and second error voltages with predetermined reference voltages to generate the first and second dead time detection signals.

10. The dead time adjusting circuit of claim 9, wherein the delay part comprises:
  a delay element having a plurality of stages and configured to delay ON timings of the first and second output switches;
  a stage number switching part configured to switch an effective stage number of the delay element; and
  a delay amount control part configured to control the stage number switching part depending on the first and second dead time detection signals to control the ON timing delay amounts of the first and second output switches.

11. The dead time adjusting circuit of claim 9, wherein each of the first and second integration parts comprises:
  an operational amplifier configured to output the first or second error voltage from an output terminal;
  a capacitor connected between an inverting input terminal and the output terminal of the operational amplifier;
  a first resistor connected between the inverting input terminal and the output terminal of the operational amplifier;
  a second resistor connected between the inverting input terminal of the operational amplifier and the first or second detection switch;
  a current source connected between a power source and a non-inverting input terminal of the operational amplifier; and
  a diode having an anode connected to the non-inverting input terminal of the operational amplifier and a cathode connected to a ground terminal.

12. A switch driving circuit comprising:
  a control circuit configured to generate a reference control signal;
  the dead time adjusting circuit of claim 9 configured to give a delay to the reference control signal to generate first and second control signals; and
  a driver circuit configured to generate first and second driving signals from the first and second control signals, respectively, and supply the generated first and second driving signals to the first and second output switches.

13. A switching power supply device comprising:
  a switch output stage including first and second output switches; and
  the switch driving circuit of claim 12 configured to drive the switch output stage,
  wherein the switch output stage is driven to generate an output voltage from an input voltage.

14. A motor driving device comprising:
  a switch output stage including first and second output switches; and
  the switch driving circuit of claim 12 configured to drive the switch output stage,
  wherein the switch output stage is driven to supply a driving current to a motor.

15. An electronic device comprising a switching power supply device comprising:
  a switch output stage including first and second output switches; and
  the switch driving circuit of claim 12 configured to drive the switch output stage,
  wherein the switch output stage is driven to generate an output voltage from an input voltage.

16. An electronic device comprising a motor driving device comprising:
  a switch output stage including first and second output switches; and
  the switch driving circuit of claim 12 configured to drive the switch output stage,
  wherein the switch output stage is driven to supply a driving current to a motor.

* * * * *